(12) United States Patent
Koslowski et al.

(10) Patent No.: US 12,308,610 B2
(45) Date of Patent: May 20, 2025

(54) SINGLE MODE SEMICONDUCTOR LASER WITH PHASE CONTROL

(71) Applicant: ADVANCED PHOTONICS APPLICATIONS GMBH, Gerbrunn (DE)

(72) Inventors: Tim Koslowski, Ochsenfurt (DE); Nicolas Koslowski, Würzburg (DE)

(73) Assignee: ADVANCED PHOTONICS APPLICATIONS GMBH, Gerbrunn (DE)

( * ) Notice: Subject to any disclaimer, the term of this patent is extended or adjusted under 35 U.S.C. 154(b) by 249 days.

(21) Appl. No.: 17/318,024

(22) Filed: May 12, 2021

(65) Prior Publication Data

US 2021/0376559 A1  Dec. 2, 2021

(30) Foreign Application Priority Data

Mar. 13, 2020 (EP) .................................... 20162911

(51) Int. Cl.
*H01S 5/22* (2006.01)
*H01S 5/028* (2006.01)
(Continued)

(52) U.S. Cl.
CPC ................ *H01S 5/028* (2013.01); *H01S 5/11* (2021.01); *H01S 5/12* (2013.01); *H01S 5/1237* (2013.01); *H01S 5/22* (2013.01); *H01S 5/4025* (2013.01)

(58) Field of Classification Search
CPC ...................................................... H01S 5/1237
See application file for complete search history.

(56) References Cited

U.S. PATENT DOCUMENTS

| 6,501,783 B1 | 12/2002 | Capasso et al. |
| 6,846,689 B2 | 1/2005 | Forchel et al. |
| (Continued) | | |

FOREIGN PATENT DOCUMENTS

| EP | 0984535 A2 | 3/2000 | |
| EP | 1283571 A1 | 2/2003 | |
| WO | WO-2005124951 A1 * | 12/2005 | ............... H01S 5/22 |

OTHER PUBLICATIONS https://math.libretexts.org/Bookshelves/Applied_Mathematics/Math_in_Society_(Lippman)/13%3A_Sets/13.04%3A_Cardinality (Year: 2024).*

(Continued)

*Primary Examiner* — Minsun O Harvey
*Assistant Examiner* — Stephen Sutton Kotter
(74) *Attorney, Agent, or Firm* — Dickinson Wright PLLC; Andrew D. Dorisio

(57) ABSTRACT

The invention relates to a method for producing a semiconductor laser comprising the method steps: generating a lateral structure layer, at least in the material abrasion areas, a basic selection of the laser modes amplified or amplifiable through stimulated emission taking place via the lateral structure layer; and generating an optical element for defining the phasing of the amplified or amplifiable laser modes, the optical element being generated in such a manner that it has a distance d to an end of the lateral structure layer in the longitudinal direction of the waveguide ridge, distance d fulfilling the condition $$\min \left| d - m \cdot \frac{\lambda_{eff}}{2} \right| \le \frac{\lambda_{eff}}{4},$$

(Continued)

m being a natural number (m∈ℕ) and $\lambda_{eff}$ being the effective wavelength in the material.

6 Claims, 2 Drawing Sheets

(51) Int. Cl.
*H01S 5/11* (2021.01)
*H01S 5/12* (2021.01)
*H01S 5/40* (2006.01)

(56) References Cited

U.S. PATENT DOCUMENTS

2005/0232329 A1* 10/2005 Thedrez .................... H01S 5/12
372/96
2017/0299822 A1 10/2017 Kondo et al.

OTHER PUBLICATIONS

Bukhari, et al.; "A Metasurfaces Review: Definitions and Applications"; Applied Sciences; Jul. 5, 2019; United Kingdom.
Kadic, et al; "3D metamaterials"; Nature Reviews; Jan. 31, 2019.
Yu, et al; "Quantum cascade lasers with integrated plasmonic antenna-array collimators"; Optical Society of America; 2008.
Burg, Klemens, et al. Hohere Mathematik Fur Ingenieure Band I. Springer Fachmedien Wiesbaden, 9th Revised Edition 2011, pp. 23 and 100.

\* cited by examiner

SINGLE MODE SEMICONDUCTOR LASER WITH PHASE CONTROL

TECHNICAL FIELD

The invention at hand relates to a method for producing a semiconductor laser according to the claims. Furthermore, the invention at hand relates to a semiconductor laser as described herein.

BACKGROUND

According to the current state of the art, semiconductor lasers are a prevalent technology for generating coherent electromagnetic radiation having properties optimized for each specific application. The application fields include in particular telecommunication, analysis and sensor technology. A plurality of these applications require single mode semiconductor lasers having a precisely adjustable, adjusted or pre-specified wavelength of the electromagnetic radiation.

Moreover, further requirements are generally applied to the radiation source regarding the electric-optical properties, such as with respect to the output power, the frequency tuning range of the wavelength or the extent of the side mode suppression.

The basic functional principle of the semiconductor lasers is the principle of stimulated emission. In this principle, the light of a mode or an oscillation mode is amplified exponentially when located in the amplification spectrum of the laser medium and the losses are minimized. A plurality of what is known as Fabry-Pérot modes, which can be excited to stimulated emission in the area of the amplification, initially exist in a semiconductor laser when no additional adjustments or further measures are carried out. Thus, generally, a broad emission spectrum of a semiconductor laser is initially yielded.

An approach known from the state of the art, by means of which the required single mode operation of a semiconductor laser can be reached starting from the generally broad emission spectrum, is disclosed in EP 0 984 535 B1, for example. This specification discloses a semiconductor laser which besides having a waveguide ridge also has a periodic grating, in particular a metal grating, disposed parallel to the waveguide ridge. The grating period, i.e., the distances from the beginning of a grating ridge to the beginning of the next grating ridge, is set as half the wavelength, in particular half the effective wavelength of the desired laser mode. The effective wavelength refers to the wavelength in the material. The grating material is chosen such that a variation of the refractive index in the surroundings of the grating rods is generated in order to determine a periodic modulation of the effective complex refractive index.

The periodic modulation of the refractive index leads to a strong wavelength dependence of losses or absorption. The periodic variation of the absorption coefficient additionally leads to losses with a strong dependence on the wavelength. This technology allows attaining an extensive restriction or reduction of the amplified or amplifiable modes. In other words, this means that the periodic structure or lateral structure, which does not necessarily have to be periodic, allows attaining a basic selection of the laser modes amplified or amplifiable by stimulated emission.

In the past, however, attaining a true single mode operation of semiconductor lasers with a high replicability according to the theoretical expectations and with the aspired wavelengths had so far not been possible using the known approach, the reason why the technology described above did not always suffice for attaining a true single mode operation of the semiconductor laser having the aspired wavelength and operational parameters having been hitherto unidentified.

This situation, however, generally leads to the disadvantage of a comparatively large portion of scrap being produced when using the known production technology or when using the known methods for producing generic semiconductor lasers, the scrap being precisely those semiconductor lasers which did not attain true single mode output spectra with the aspired wavelength despite corresponding lateral structures or periodic structures for the modulation of the refractive index.

With this background, the object of the invention at hand is to propose a semiconductor laser and a method for producing a semiconductor laser which both overcome the disadvantages of the state of the art and in particular allow attaining a predictable and reliable production of true or actual single mode semiconductor lasers.

SUMMARY

This object is attained by a production method having the features as described herein. Furthermore, this object is attained using a semiconductor laser having the features as described herein. Advantageous embodiments are the subject matter of the dependent claims.

This object is attained by a method for producing a semiconductor laser which comprises applying a multilayer structure on a semiconductor substrate, the layers of the multilayer structure extending parallel to a layer extension plane defined by a surface of the semiconductor substrate and the application of the multilayer structure including at least the generation of an active region. Furthermore, it is also provided in a known manner within the scope of the method for a waveguide ridge to be formed by material of the multilayer structure being abraded in at least two material abrasion areas separated from each other, the material essentially being abraded perpendicular to the layer extension plane. Likewise in a generally known manner, the method comprises the generation of an insulation layer on at least the material abrasion areas and the generation of a lateral structure, at least in the material abrasion areas, a basic selection of the laser modes amplified or amplifiable by stimulated emission taking place via the lateral structure. Likewise in an also generally known manner, the method further comprises the generation of facet layer structures, which serve for reflecting and/or decoupling laser radiation and are disposed perpendicular to the layer extension plane in the longitudinal direction of the waveguide ridge on a cavity end or on two opposite cavity ends.

According to the invention at hand, the method moreover comprises a method step for generating an optical element for defining the phasing of the amplified or amplifiable laser modes, the optical element being generated in such a manner that the distance in the longitudinal direction of the waveguide ridge is set such that the phasing between the lateral structure and the optical element can be controlled better than π/4. From this follows that the following applies to distance d:

$$\min\left|d - m\cdot\frac{\lambda_{eff}}{2}\right| \le \frac{\lambda_{eff}}{4}.$$

In this case, m is a natural number (m∈ℕ) and $\lambda_{eff}$ is the effective wavelength in the material.

According to the invention, it is therefore provided for the optical element to be disposed in a precise position or at a precise distance with respect to the end of the lateral structure layer and to moreover be suitable for setting the phasing of the amplifiable or amplified laser modes so that effectively, precisely one laser mode remains to be amplified or can be amplified and that accordingly a true single mode operation of the semiconductor laser can be reliably generated or attained. As can be taken from the condition above, a number of possible distances exist in this context which can fulfill the criterion and thus can serve for defining the phasing according to the invention. Realizing the invention is thus especially facilitated as a corresponding distance can be selected according to the condition and the optical element can be generated depending on the manner in which the optical element is generated.

As will be described in more detail in the following, different possibilities or different effects are generally available by means of which the optical element can take influence on the phasing of the amplified laser modes. Generally, however, the influence on the phasing is tied to the influence on the effective refractive index of the laser cavity. This means in turn that the optical element is suitable or must be suitable for influencing the effective refractive index of the laser cavity as a whole.

The influence taken on the effective refractive index can be attained by periodic structures. As will be described in even more detail in the following, however, other measures and accompanying or optically effective structures can exert the desired influence.

The effective refractive index of the laser cavity is a comprehensive property of the laser cavity, which is derived from the solution of the wave equation or wave equations of the laser cavity. In other words, this means that a mode selection of precisely one laser mode can be attained by the precise positioning of the optical element at a distance d to the lateral structure, in particular to one end of the lateral structure, to which $$\min \left| d - m \cdot \frac{\lambda_{\mathit{eff}}}{2} \right| \leq \frac{\lambda_{\mathit{eff}}}{4}$$

applies, under consideration of the effects of the optical element on the effective refractive index of the entire laser cavity. This also means that for realizing the optical elements according to the invention, the wave equation for the laser cavity also influences the properties of the optical element or pre-specifies these.

Within the scope of the solution to the mentioned wave equation of the laser, the corresponding desired effect of the optical element on the effective refractive index can, on the one hand, be determined while on the other hand an explanation for the hitherto unreliable production of single mode semiconductor lasers can be derived therefrom.

For in the current state of the art, the edges of semiconductor lasers were imprecisely refracted or split within a certain scope, so that an overall comparatively imprecise entire length of the laser cavity was given. This impreciseness regarding the length of the laser cavity of approximately +/−15 micrometers led to an inexact distance between the lateral structure or the periodic grating for basic selection of the amplified laser modes on the one hand and the facet defining the cavity length on the other hand. This inexact distance was not always in the range of $$\min \left| d - m \cdot \frac{\lambda_{\mathit{eff}}}{2} \right| \leq \frac{\lambda_{\mathit{eff}}}{4}$$

because of the imprecision mentioned above. Consequently, the phasing of the amplifiable laser modes according to the state of the art mentioned above remained uncontrolled and modes other than the desired laser mode could be amplified based on overlapping frequency fluctuations which did not exactly correspond to the mode desired by the lateral structure layer or the wavelength-selective element. This led to the imprecise or unreliable mode selection prevalent in the state of the art.

The overlapping frequency fluctuations, which are prevented or suppressed by the exact phasing owing to the optical element according to the invention and/or by the exact positioning of the optical element, are most likely ascribed to the Floquet theory, which as the mathematical basis of the Bloch theorem says that the solutions to the wave equation or mode equation can be represented as a superposition of a wave extending to the right and a wave extending to the left, which can lead not only to the desired stationary waves depending on the cavity properties and technical conditions, in particular the shape of the facets, but also to stationary waves having a frequency fluctuation. It is believed that this type of frequency fluctuations or fluctuation frequencies are the reason or at least a significant reason behind the hitherto unsatisfactory or at least not reliably replicable production of single mode semiconductor lasers.

The method according to the invention and in particular the generation and positioning of the optical element for defining the phasing and the effective refractive index of the amplified or amplifiable laser modes, however, prevents or suppresses the mentioned frequency fluctuation, leading to reliable single mode semiconductor lasers being able to be produced.

In other words, this means that the generation of the optical element according to the invention further specifies or determines a preselection or basic selection, which is made by the lateral structure layer, in particular by the periodic grating, of amplified or amplifiable modes via the exact definition of the phasing of the mode in the resonator or in the laser cavity, leading to the result that effectively, precisely one laser mode having a desired wavelength remains to be amplified and decoupled.

The distancing of the optical element as intended by the invention from the end of a lateral structure layer or a periodic grating conditioning the basic selection of modes provides for a sufficiently precise determination or definition of the cavity length of the laser cavity.

An advantageous first embodiment of the method provides for the optical element to be generated simultaneously with the formation of the facet layer structure or for said optical element to be generated on the facet layer structure in subsequence to the formation of said facet layer structure. The optical element itself can also be realized as a facet layer structure. This embodiment can generally provide for the optical element to not have any overlap or to only have a partial overlap with the afore-mentioned lateral structure layer perpendicular to the layer extension plane. When the optical element is applied or is realized in the course of forming the facet layer structure or in subsequence to the formation of the facet layer structure, it can be provided, for example, for the optical element to be formed on the facet, which is disposed perpendicular to the layer extension plane below the lateral structure, in the areas of the multilayer structure. In spite of all this, the distance according to the invention between the optical element and the end of the lateral structure layer in the longitudinal direction of a waveguide ridge is to be defined by corresponding distances concerning planes which on the one hand extend parallel to the respective facet and thus perpendicular to the layer extension plane and on the other hand extend equally perpendicular to the longitudinal direction or at least essentially perpendicular to the longitudinal direction of the waveguide ridge.

Generally different possibilities or options are available, as will be described below in further detail, when forming the optical element simultaneously with or in subsequence to the formation of the facet layer structure or as a facet layer structure. As described above, it is imperative that not only distance d is controlled precisely enough but also that the desired phasing is attained by the optical element via a corresponding setting of the effective refractive index of the laser cavity.

When realizing the optical elements simultaneously with the facet layer structure or on the facet layer structure, considerable advantage can be taken of the fact that the lateral structure layer of the semiconductor laser effecting the preliminary selection can generally be realized without difficulty all the way to a breaking edge or splitting edge of a semiconductor laser or a corresponding laser layer structure, meaning that positioning the optical element in a manner according to the invention is easily possible at a distance d having the precision of $$\min \left| d - m \cdot \frac{\lambda_{\mathit{eff}}}{2} \right| \leq \frac{\lambda_{\mathit{eff}}}{4}$$

or, for example, for m=1 of at the most half the wavelength, in particular of less than half the effective wavelength, even if, for example, a facet layer structure is first realized or deposited on a correspondingly split or fractured facet. For such facet layer structures can generally be realized having an overall thickness or having an overall layer thickness of less than half the effective wavelength of the semiconductor laser. The facet layer structures typically range from several tens of nanometers to several hundreds of nanometers in thickness.

A particularly preferred embodiment of the method can provide for the optical element to be generated by a variation of layers and/or layer properties of layers of the facet layer structure which are otherwise intended for optimizing and/or setting a laser threshold or an output power. Carrying out this embodiment of the method particularly advantageously allows the facet layer structure to not only ensure the function for setting or optimizing the laser threshold and/or for setting or optimizing the output power but additionally to simultaneously function as a whole or at least in part as an optical element as defined by the invention. For this purpose, it can or must be necessary to optimize the facet layer structure both with respect to the other laser properties and with respect to its function as an optical element or to find an appropriate compromise, which, however, also ensures a function as an optical element according to the invention.

The embodiment described above is advantageous in particular for the reason that it enables effectively carrying out the method for producing the semiconductor laser according to the invention. Due to the circumstance that coating facets with a facet layer structure usually takes place for many semiconductor lasers, additional method steps may no longer be required when realizing a facet layer structure combined with an optical element according to the invention. Instead, it can suffice to change the layer properties and/or the layer sequence, which is/are provided for generating the facet layer structure anyways, in such a manner that a definition of the phasing of the amplified laser modes as intended by the invention when the optical element is distanced to the lateral structure layer equally as intended by the invention is made possible besides allowing a corresponding influencing of the laser threshold and/or the output power.

Another particularly advantageous variation of the method according to the invention intends for the generation of the optical element to include the formation of meta-optical metal structures. Such meta-optical metal structures having suitable resonance properties are well suited for taking influence on the effective refractive index of the overall laser cavity. At the same time, such meta-optical metal structures can be generated with sufficient precision via the principally known method. This advantageously enables attaining a corresponding influence of the phasing of the amplifiable laser modes. For an example of such structures, reference is made to N. Yu et al., *Optics Express*, volume 16, issue 24, page 19447 (2008).

Moreover, it can be intended for the generation of the optical element to include the formation of metallic and/or organic three-dimensional structures, which are hardened selectively from a liquid or a viscous precursor preferably in a two-photon polymerization method. Both meta-optical metal structures and metallic and/or organic three-dimensional structures are formed particularly preferably on a corresponding facet layer structure while maintaining the distance from the lateral structure layer, in particular from the end of the lateral structure layer, as intended by the invention. The methods for producing such three-dimensional structures, preferably within the scope of a two-photon polymerization method, can provide correspondingly fine structures having sufficient precision, the structures themselves being able to serve for taking an influence on the phasing or for influencing the effective refractive index of the overall laser cavity. Equally advantageously, it can be intended for the generation of the optical element to include the formation of dielectric layer structures and/or mirror layer structures, while taking into consideration the influence of the phasing of the amplified or amplifiable laser modes. The optical layer structures mentioned, namely the electric layer structures or mirror layer structures, are generally known and widely used and can therefore be produced with corresponding precision and reliably, i.e., with a high replicability. A particular prerequisite is, however, that according to the present invention the corresponding layer structures are not only used for applying a reflective or an anti-reflection coating as such but are selected or formed in conjunction with the lateral structure layer with regard to their properties in terms of the definition of the phasing. This means that the condition of the invention regarding distance d to the end of the lateral structure layer provides precisely for the optical element to be phased with the lateral structure layer and thus to ensure the mode selection for an individual mode. This is generally valid for the optical element and for other or similar types of mirrors or reflective elements. Likewise, the other functions, e.g., the functions as mirror elements or reflective elements, are to be taken into consideration when constructing or sizing the entire semiconductor-laser arrangement or semiconductor-laser diode. For instance, a DBR element (distributed Bragg reflector) can be provided. The DBR element can be disposed in the area of the material abrasion areas and/or of the waveguide ridge. Alternatively thereto, a dielectric mirror, whose phase is precisely adjusted, can be formed on a facet layer structure.

Influencing the facet as such for the formation of the optical element can be intended. For instance, the properties according to the invention and thus the optical element can be attained by an etching method for treating the facets.

Providing or forming the optical element so as to have an extension or propagation essentially or at least also parallel to the layer extension plane can constitute a viable alternative to forming the optical element perpendicular to the layer extension plane, in particular parallel to a facet layer structure.

As previously indicated, an advantageous embodiment accordingly provides for the optical element to be formed in the area of the multilayer structure, preferably in the area of the waveguide ridge or in the area between a waveguide ridge and a cavity end.

This, for instance, can yield the advantage of the optical element being able to be formed even before the semiconductor lasers have been separated from a compound, in particular a corresponding wafer, having a plurality of semiconductor lasers. Likewise, forming a corresponding plurality of optical elements at the same time or simultaneously via corresponding method steps becomes an advantageous possibility for a plurality of semiconductor lasers available in a compound.

In this case, it can be advantageous if the lateral structure layer or the element, in particular a grating or a lateral structure layer, providing the basic selection of the modes is not formed up to an end of a laser cavity or a subsequently partially separated or fully separated laser cavity. For, owing to this, the optical element can function as a length-defining element of the laser or the laser cavity in addition to its phase-defining function, wherein distance d must be maintained between the optical element on the one hand and the end of the lateral structure as intended by the invention.

The formation of the optical element in the area of the multilayer structure, preferably in the area of the waveguide ridge or in the area between a waveguide ridge and a cavity end, also has the advantage that this process enables realizing a distance between the end of the lateral structure and the original or actual cavity end. Independently of the function of the optical element as intended by the invention, this can also have an additional advantageous effect on the far field of the semiconductor laser.

According to a particularly preferred embodiment, it can be intended, for example, that the generation of the optical element includes the formation of an active or passive phase segment, which is preferably formed on or at the waveguide ridge. Active or passive heating elements, inter alia, can be provided as phase segments, the active or passive heating elements heating the surroundings in the semiconductor laser via an electric or ohmic heating effect or the corresponding heat development resulting from current flow, the heating of the surroundings in turn leading to an influencing of the effective refractive index and thus to a definition of the phasing of the amplified laser modes. An active phase segment can, for example, comprise an individually controllable power supply and/or comprise a corresponding separate electric contact. For a passive phase segment, a current feed and a heating effect or heat development based on the laser pumping current can be used in order to at least cause a targeted heat development or heating. Via the corresponding arrangement of the phase segment, the distance to the end of the lateral structure layer can be maintained as required by the invention in addition to the targeted influencing of the effective refractive index.

Alternatively, a phase segment, for example, can also be realized by taking advantage of the Kerr effect.

The formation of the optical element in the area of the multilayer structure, preferably in the area of the waveguide ridge or in the area between a waveguide ridge and a cavity end, e.g., in a kind of interrupted or direct continuation of the waveguide ridge while maintaining distance d from the end of the lateral structure layer, also has the advantage of even bringing about a distance between the end of the lateral structure and the original or actual cavity end in a targeted manner owing to this. This can have an additional advantageous effect on the far field of the semiconductor laser independently of the function of the optical element according to the invention.

Another advantageous embodiment of the method can provide for the optical element to be formed in the multilayer structure via ion implantation. Preferably, ion implantation is also undertaken in the active region in this case. More preferably, the ion implantation can take place in an area which is disposed in the layer extension plane between an end of a waveguide ridge and an original or actual end of the laser cavity or the semiconductor laser.

Furthermore, it can be advantageously provided for the optical element to be formed in the multilayer structure by generating photonic crystals. Preferably, it can be provided for the structures, in particular the holes, which form the photonic crystal, to be structured through the entire epitaxial structure of the semiconductor up to a buffer layer, although variations for setting the coupling strength are possible.

Just as advantageously, it can be provided for the optical element to be formed by generating photonically integrated circuits. The elements, which form the photonically integrated circuit, can be structured, in particular etched, in a part of or in the entire multilayer structure adjacent to, i.e., in the longitudinal direction of, a waveguide and thus between the end of a waveguide and the physical or actual end of the laser or the laser cavity. In this context, it is possible that, for example, a part of a lower cladding or a lower cladding layer remains deliberately untouched or unstructured. The optical element can, for example, have the shape of a circle or a closed curve.

Furthermore, it can be advantageously provided for a plurality of semiconductor lasers to be realized so as to be adjacent to one another or to abut against one another on a shared semiconductor substrate, in particular a wafer, and that the semiconductor lasers are separated, preferably by forming an array or a matrix arrangement having several adjacent and interconnected semiconductor lasers, subsequently to the formation, in particular by using a suitable separation method.

As previously indicated above, it can also advantageously be provided, on the one hand, for the optical element to be formed for several adjacent semiconductor lasers, preferably for all semiconductor lasers of a shared array or matrix arrangement, in particular simultaneously. This also applies to forming the optical element in the area of the facet or in the area of the facet layer structure and to forming the optical element in the area of the waveguide ridge or in the area of the material abrasion areas, in particular having an extension parallel to the layer extension plane. Particularly preferably, it can be provided for the optical element to be formed before separating groups of semiconductor lasers or groups of semiconductor-laser cavities. The groups can each be provided for an operation of individual semiconductor lasers or for the operation of compounds of several semiconductor lasers or can be suitable for such operations.

With regard to the semiconductor laser, the object mentioned above is attained by a semiconductor laser having a multilayer structure comprising at least one waveguide ridge and a material abrasion area disposed laterally to the waveguide ridge, the multilayer structure being disposed on a semiconductor substrate and a layer extension plane being defined by a surface of the semiconductor substrate, the multilayer structure having at least one active region, and the active region having a layer or material structure for forming a laser layer based on the principle of stimulated emission, a lateral structure layer being further provided at least in the material abrasion areas, preferably on an insulation layer, a basic selection of the amplified or amplifiable laser modes being made via the lateral structure layer and facet layer structures, which serve for reflecting and/or decoupling laser radiation, being formed on a cavity end or on two opposite cavity ends perpendicular to the layer extension plane in the longitudinal direction of the waveguide ridge, in such a manner that the semiconductor laser comprises an optical element for defining the phasing of the amplified or amplifiable laser modes, the optical element having a distance d to the lateral structure layer in the longitudinal direction of the waveguide ridge, distance d fulfilling the condition $$\min \left| d - m \cdot \frac{\lambda_{\text{eff}}}{2} \right| \leq \frac{\lambda_{\text{eff}}}{4}.$$

Via the optical element according to the invention, a defined cavity length of the semiconductor laser is attained on the one hand or, in other words, forming or providing an area, in which a lacking phase definition favors or causes overlapping frequency fluctuation modes to develop or to be amplified, in the longitudinal direction of the waveguide ridge is prevented. Furthermore, besides or in addition to the definition of the cavity length, the phasing of the amplified or amplifiable laser is also defined, meaning that the optical element overall reduces a number of amplifiable or amplified modes, which has been predefined or previously narrowed down by the lateral structure layer, to precisely one amplified laser mode and thus allows a safe and reliable function of the semiconductor laser in a single mode operation type.

To avoid any unnecessary repetitions, the embodiment of the method according to the invention described above and its advantageous embodiments are referred to with regard to the advantages and advantageous effects and with regard to the features of the device of the semiconductor laser. In other words, features disclosed with respect to the method are to be viewed as product features or device features and vice versa.

A first advantageous embodiment of the semiconductor laser provides for the optical element to be embedded in the facet layer structure or to be disposed on the facet layer structure or to be realized as a facet layer structure. This allows advantageously attaining the required maximum distance from the end of the lateral structure layer as well as the desired influencing of the effective refractive index of the entire laser cavity and thus the phasing of the amplifiable laser modes.

Advantageously, it can be provided for the optical element to have meta-optical metal structures. The meta-optical metal structures can be advantageously formed on a facet layer structure such that in particular the effect of the optical element defining the phasing becomes particularly noticeable.

It can also be advantageously provided for the optical element to have metallic and/or organic three-dimensional structures, which are hardened selectively from a liquid or viscous precursor preferably in a two-photon polymerization method. Structures of this kind, in particular three-dimensional structures, are also well suited for setting the phasing of the laser radiation or the amplifiable laser modes and can be realized safely and precisely, e.g., on a facet layer structure. Corresponding structures can also be printed structures, even if the method used for production is more like an additive method rather than a classic printing method.

Furthermore, it can advantageously be provided for the optical element to have dielectric layer structures and/or mirror layer structures. Said structures are sufficiently known in the field of semiconductor optics and can be used advantageously as an optical element as intended by the present invention in addition to their functions as mirrors, filters or the like, the structures then serving first and foremost or overall for precisely setting the phasing of the amplifiable laser modes at a specific distance to the end of the lateral structure layer.

Furthermore, it can be advantageously provided for the optical element to be formed in the area of the multilayer structure, preferably in the area of the waveguide ridge or in the area between a waveguide ridge and a cavity end. In contrast to a formation in the area of the facet layer structure, an extension at least also parallel to the layer extension plane is intended when a formation takes place in the area of the multilayer structure. The reverse conclusion, however, specifically does not preclude an extension in the direction perpendicular to the layer extension plane. In fact, the optical elements can also be available as three-dimensional structures in the area of the multilayer structure, the three-dimensional structures then preferably extending in the area of the waveguide ridge or between the waveguide ridge and the physical cavity end both across an area in the layer extension plane and across an area perpendicular to the layer extension plane.

Preferably, the optical element can be realized as an active or a passive phase segment, which is disposed in particular on or at the waveguide ridge. The phase segment can cause an influencing of the phasing via an influencing of the effective refractive index owing to a heat development resulting from an electric current. Without difficulty, the effect of the phase segment can be dimensioned so precisely that the distance having the precision $$\min \left| d - m \cdot \frac{\lambda_{\text{eff}}}{2} \right| \leq \frac{\lambda_{\text{eff}}}{4}$$

is given for the optical element and the lateral structure layer.

Just as advantageously, it can be provided for the optical element to be formed as an ion implantation area of the multilayer structure. For instance, a modulation of the refractive index can be caused locally by a corresponding ion implantation area, the refractive index also affecting the effective refractive index of the entire laser cavity and thus adding to the phase definition of the amplified or amplifiable laser modes. An ion implantation area can also be formed as intended by the invention while maintaining distance d having the precision $$\min \left| d - m \cdot \frac{\lambda_{\text{eff}}}{2} \right| \leq \frac{\lambda_{\text{eff}}}{4}$$

to an end of the lateral structure layer.

Likewise, the optical element can also be advantageously realized as an area in the multilayer structure having photonic crystals. Advantageously, it can also be provided for the optical element to be formed as a component of a photonically integrated circuit. The circuit can be formed in the multilateral structure, e.g., between an end or directly adjacent to a waveguide ridge and a physical cavity end, via already known masking, light exposure or etching methods. Moreover, it can be provided for a corresponding component of the photonically integrated circuit to be heated or to be actively controlled in temperature, for example, to even better define the phasing of the amplifiable laser modes.

BRIEF DESCRIPTION OF THE DRAWINGS

Examples and advantageous embodiments of the invention at hand can be taken from the enclosed, purely schematic drawings.

DETAILED DESCRIPTION

Figure 1:
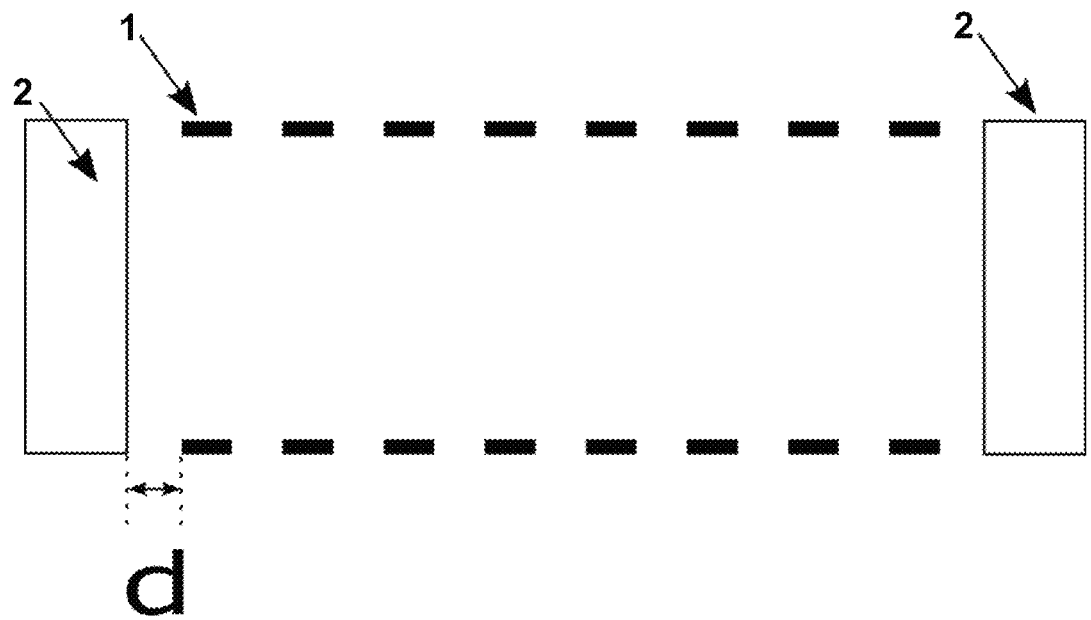
FIG. 1 shows a schematic illustration of the functioning of the semiconductor laser according to the invention.

In a top view of a layer extension plane, FIG. 1 shows the general functioning or the general position of optical element 2 according to the invention with respect to a lateral structure layer 1. Lateral structure layer 1 (only hinted at) can be formed from parallel ridges, e.g., a metallic material, as a so-called DFB structure or distributed feedback structure, only corresponding dashes for symbolizing the ridges being marked in the illustration of FIG. 1. According to recent findings, a lateral structure layer which does not consist of parallel ridges but is optimized in two spatial directions can just as easily improve properties of a semiconductor laser.

Ergo, the lateral structure layer is not meant to be exclusively understood as an arrangement of parallel, preferably metallic ridges having an equal distance for generating a periodic grating but in general as structure layers which enable at least a basic selection of a large amount of laser modes amplifiable in a laser cavity.

In FIG. 1, two rows of ridges of lateral structure layer 1 are hinted at. Between these, a waveguide ridge (not illustrated in FIG. 1) could be disposed. Optical element 2 according to the invention is located having a distance d to the end of lateral structure layer 1, distance d being at most half of the effective wavelength of the desired laser radiation. This leads to the optical element acting in a length-defining manner on the laser cavity. Furthermore, the generation and amplification of overlapping frequency fluctuation modes are effectively suppressed via precisely set distance d. Moreover, the suitable formation of the optical element at distance d, namely, by setting the effective refractive index of the entire laser cavity while taking into consideration optical element 2, defines a precise phasing of the amplifiable laser modes so that effectively, only one individual laser mode is amplified and decoupled and thus a single mode operation type of the laser is made possible.

In the example of FIG. 1, an optical element 2 is disposed at each of two ends of lateral structure layer 1. While such an arrangement can be advantageous, it need not necessarily be realized, however. For instance, an individual optical element 2 can suffice for determining the phasing of the amplified laser mode and for suppressing or preventing overlapping frequency fluctuation modes.

Figure 2:
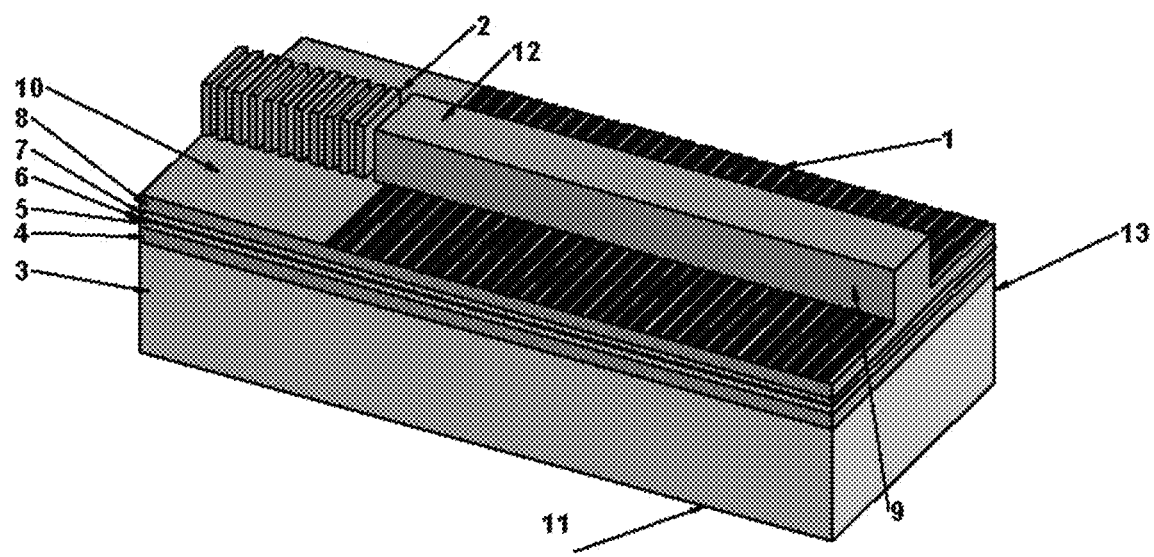
FIG. 2 shows a schematic exemplary illustration of a semiconductor according to the invention in a perspective view.

FIG. 2 shows a perspective view of an embodiment of a semiconductor according to the invention in an exemplary and schematic manner. The semiconductor comprises a substrate 3, on which a layer structure or multilayer structure 4-9 suitable for generating and decoupling laser radiation is applied epitaxially.

For instance, multilayer structure 4-9 can serve for forming a semiconductor laser, for example an interband cascade laser or a quantum cascade laser. Multilayer structure 4-8 comprises an active zone 6 surrounded by an upper and a lower waveguide layer 5, 7, which in turn are embedded in an upper and a lower cladding layer 4, 8, 9. A waveguide ridge 9 is formed from upper cladding layer 8, 9 in the area of material abrasion areas 10 via a material abrasion method. Contact layers 11, 12 serve for injecting current.

In addition to waveguide ridge 9, optical element 2 according to the invention is formed by the material abrasion method. In the example of FIG. 2, this takes place in the form of a mirror layer structure, namely in the form of a distributed Bragg reflector, which on the one hand has the arrangement already schematically illustrated in FIG. 1, in particular distance d illustrated in FIG. 1 to the end of lateral structure layer 1 and moreover defines the phasing of the amplified or amplifiable laser modes and thus contributes to the further mode selection, up to precisely one a laser mode. Optical element 2 is disposed in the area of multilayer structure 4 to 8 and 9 in the example of FIG. 2, that is in the longitudinal direction of waveguide ridge 9 between an end of waveguide ridge 9 and an end of the laser cavity.

Alternatively or additionally thereto, it can be provided for optical element 2 to be disposed in the area of a facet 13. For this purpose, it can be provided for optical element 2 to be either embedded in a facet layer structure (not illustrated in FIG. 2 itself) or to be applied on the outside of the facet layer structure in the longitudinal direction of waveguide ridge 9. As can be discerned on the right-hand end of the laser cavity according to FIG. 2, lateral structure layer 1 can be guided towards or can be formed on the cavity end without difficulty, so that distance d of the desired laser mode according to the invention can be easily maintained when forming optical element 2 in the area of the facet of the semiconductor laser, in particular on a facet layer structure or within a facet layer structure. For the facet layer structure, which is otherwise intended for optimizing or setting the laser threshold and/or the output power, in general has an overall thickness of only a few tens of nanometers up to several hundreds of nanometers. Particularly preferably, it can thus even be provided for optical element 2 to be introduced, in particular integrated, into the facet layer structure in such a manner that the otherwise provided layers of the facet layer structure are only adjusted regarding their properties and/or regarding their sequence, meaning the method steps for forming the facet layer structure can also be carried out for simultaneously forming optical element 2 according to the invention.

Figure 3:
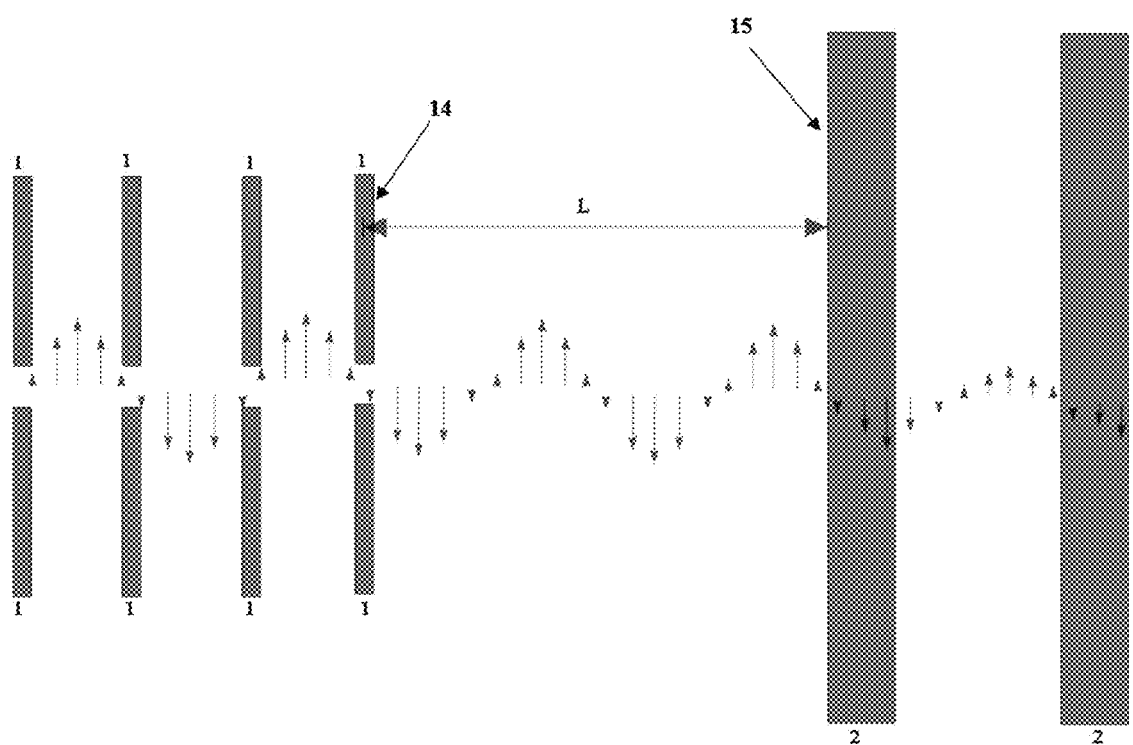
FIG. 3 shows a schematic illustration of the electric field of the light mode of a semiconductor laser according to the invention.

FIG. 3 shows a schematic illustration of electric field E of the light mode of a semiconductor laser according to the invention. The arrows represent field strength E and the direction of the electric field of the light mode at a set point in time. Distance d between the end 14 of the wavelength-selective element or lateral structure layer 1 and the beginning 15 of an optical element 2 according to the invention in the form of a DBR mirror, which is determined via the first transition from the left from a higher to a lower refractive medium, ideally is an integral multiple of half the wavelength in the medium according to the invention. The example shows four half wavelengths. According to the invention, the phasing between the wavelength-selective element or lateral structure layer 1 and the DBR segment or optical element 2 is adjusted in such a manner that both elements are phased for the desired wavelength. This is sufficiently ensured by the required specificity of the condition according to the invention $$\min \left| d - m \cdot \frac{\lambda_{\mathit{eff}}}{2} \right| \le \frac{\lambda_{\mathit{eff}}}{4}.$$

The invention claimed is:

1. A semiconductor laser, comprising:
a multilayer structure comprising at least one waveguide ridge and material abrasion areas laterally abutting against the waveguide ridge, the multilayer structure being disposed on a semiconductor substrate and a layer extension plane being defined by a surface of the semiconductor substrate, the multilayer structure having at least one active region, the active region having a layer structure and/or material structure for forming a laser layer based on the principle of stimulated emission, a lateral structure layer being provided at least in the material abrasion areas, a selection of the laser modes amplified or amplifiable via stimulated emission taking place via the lateral structure layer, and facet layer structures, which serve for reflecting and/or decoupling laser radiation, being formed on a cavity end or on two opposite cavity ends perpendicular to the layer extension plane in the longitudinal direction of the waveguide ridge,
wherein the semiconductor laser has an optical element for defining the phasing of the amplified or amplifiable laser modes, the optical element having a distance d to an end of the lateral structure layer in the longitudinal direction of the waveguide ridge, the distance d fulfilling the condition of a minimum of an absolute value of an expression d−m·λ_eff/2 being less than or equal to λ_eff/4, m being a natural number (m∈ℕ) and λeff being the effective wavelength in the material, and
wherein meta-optical metal structures are formed on a facet layer structure of the optical element.

2. The semiconductor laser according to claim 1, wherein the optical element is embedded in the facet layer structure or is disposed on the facet layer structure.

3. The semiconductor laser according to claim 1, wherein the optical element has metallic and/or organic three-dimensional structures, which are hardened selectively from a liquid or a viscous precursor.

4. The semiconductor laser according to claim 1, wherein the optical element has dielectric layer structures and/or mirror layer structures.

5. The semiconductor laser according to claim 1, wherein the optical element is formed in the area of the multilayer structure.

6. The semiconductor laser according to claim 5, wherein the optical element is realized as an ion implantation area of the multilayer structure or as an area of the multilayer structure having photonic crystals or as a component of a photonically integrated circuit.

* * * * *